United States Patent [19]
Correll, Jr. et al.

[11] Patent Number: 5,681,174
[45] Date of Patent: Oct. 28, 1997

[54] ELECTRICAL CONNECTOR WITH RELEASABLE POSITIONING COVER

[75] Inventors: Robert Stewart Correll, Jr., Harrisburg; John Thomas Larkin, Jr., New Cumberland; Andrew Dewitt Balthaser, Dauphin, all of Pa.

[73] Assignee: The Whitaker Corporation, Wilmington, Del.

[21] Appl. No.: 576,723

[22] Filed: Dec. 21, 1995

[51] Int. Cl.$^6$ .................................................. H01R 13/44
[52] U.S. Cl. ............................................ 439/135; 439/940
[58] Field of Search ................................. 439/135, 940

[56] References Cited

U.S. PATENT DOCUMENTS

| | | | |
|---|---|---|---|
| 4,396,245 | 8/1983 | Lane. | |
| 5,147,209 | 9/1992 | Litwin et al. | 439/70 |
| 5,242,311 | 9/1993 | Seong | 439/940 X |
| 5,249,977 | 10/1993 | Tanaka et al. | 439/135 |
| 5,277,601 | 1/1994 | Miyazawa | 439/135 |
| 5,361,492 | 11/1994 | Miyazawa | 439/940 X |

*Primary Examiner*—P. Austin Bradley
*Assistant Examiner*—Daniel Wittels

[57] ABSTRACT

A cover (10) adapted to be releasably secured to an electrical connector assembly (30) for positioning the assembly (30) to a surface of an electrical article (70) by use of a vacuum-suction nozzle (66). The connector assembly (30) includes a housing (32) having a transverse body section 33) and a plurality of electrical terminals (50) disposed therein and extending above the body section (33). The cover (10), which overlies at least a central region of the housing, has a plate (12) having planar top surface (14) and at least one projection (18) extending substantially perpendicularly from a lower surface (16) of the cover (10) intermediate the side edges thereof. The projection (18) is dimensioned to be received in a central location of the connector assembly (30) and to be releasably gripped by cooperating surfaces therein. The cooperating surfaces exert sufficient force against the at least one projection (18) to retain the cover (10) on the connector assembly during positioning of the connector assembly to the electrical article (70) whereafter the cover (10) is removable from the assembly (30).

4 Claims, 5 Drawing Sheets

ELECTRICAL CONNECTOR WITH RELEASABLE POSITIONING COVER

FIELD OF THE INVENTION

The present invention relates to a cover for use in positioning electrical connectors to the surface of a circuit board by the use of a vacuum-suction nozzle and more particularly to a cover for use with surface mount electrical connectors.

BACKGROUND OF THE INVENTION

The use of vacuum-suction type, pick-and-place tools to pick up and position electrical connectors on circuit boards or other electrical article is well known. When the electrical connector has a flat top surface the surface is convenient for vacuum engagement by the nozzle. Many connectors, however, have open cavities between rows of terminals or may have arrays of pin terminals projecting from a top surface thereof, thus preventing the direct use of the vacuum-suction nozzles. It is desirable therefore, to provide such connectors with a device that can be used to automatically position the connector but be removable thereafter.

SUMMARY OF THE INVENTION

The present invention is directed to providing a cover for use in automatically mounting electrical connectors to the surface of electrical articles with the use of vacuum-suction nozzles regardless of the configuration of the top surface of the connectors. The invention is directed to a cover that is adapted to be releasably secured to the connector, the cover having a plate with a planar top surface for vacuum engagement with the nozzle. The cover has at least one projection extending substantially perpendicularly from a lower surface of the plate intermediate side edges thereof, the projection being dimensioned to be received in a central location of the connector assembly and to be releasably gripped by cooperating surfaces therein.

In one preferred embodiment, the cover is intended for use with a connector assembly including a housing having opposed post mating and mounting faces and a plurality of electrical terminals disposed therein having resilient contact portions exposed at the mating face of the housing and defining a gap therebetween. The cover is dimensioned to overlie at least a central region of the housing. The contact portions exert sufficient force against the projection to retain the cover on the connector assembly during positioning of the connector to the electrical article. In accordance with one aspect of the invention the connector housing is a receptacle having an elongate cavity and two opposed rows of terminals having exposed contact section. The projection of the cover is disposed into the cavity and is secured therein by resilient contact portions in the two rows.

According to another aspect of the invention, the housing is a pin header having an array of pins and the projection of the cover is disposed in the gap between the pins and secured by an interference fit therebetween.

According to a further embodiment, a transverse body of the connector housing includes a recess therein adapted to receive and releasably grip the forward portion of the projection of the cover. The recess may define a cavity within the base or may extend completely through the base.

Embodiments of the invention will now be described by way of example with reference to the accompanying drawings.

BRIEF DESCRIPTIONS OF THE DRAWINGS

DETAILED DESCRIPTION OF THE PREFERRED EMBODIMENTS

Figure 1:
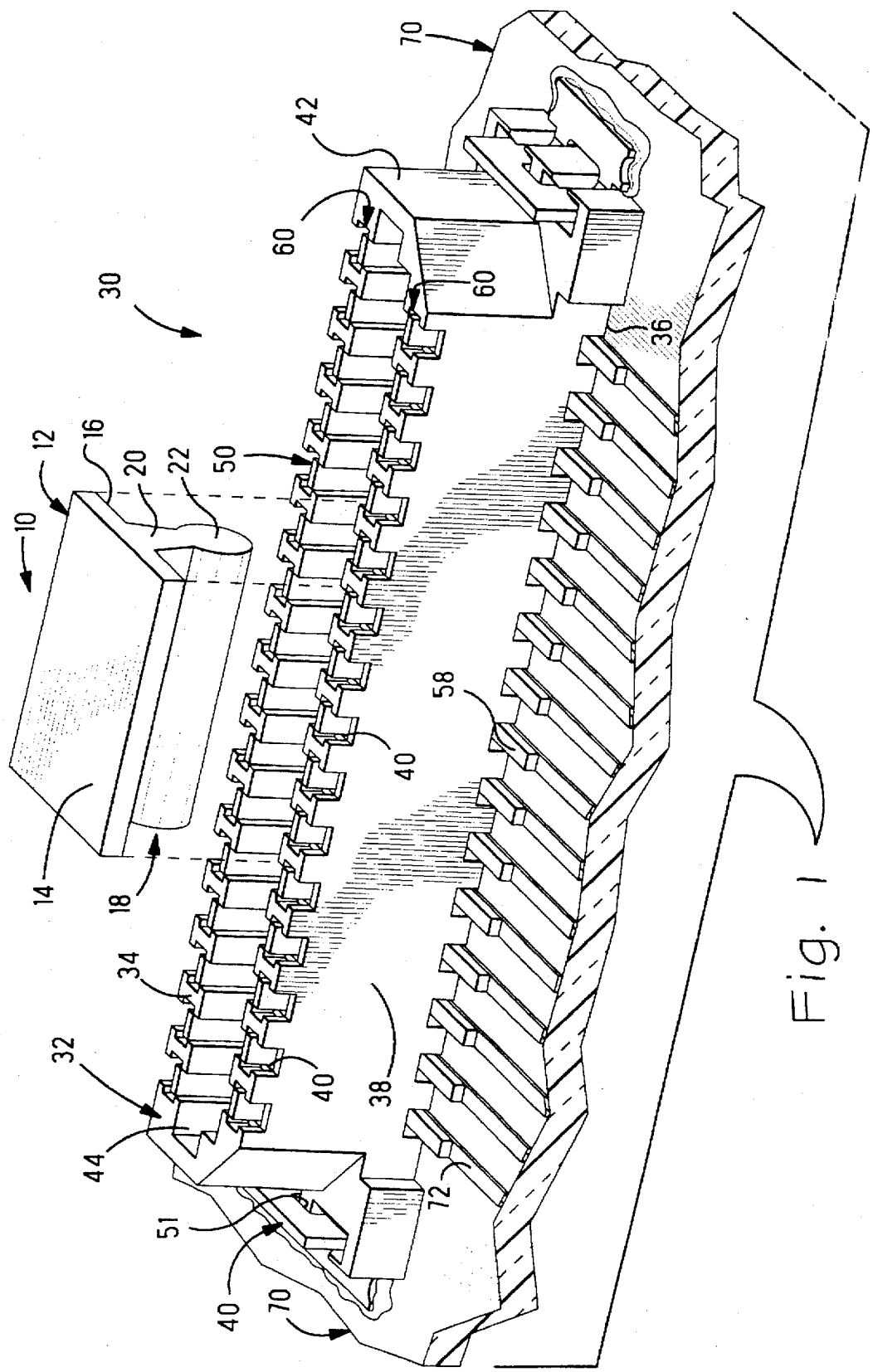
FIG. 1 is a connector assembly having a cover made in accordance with the invention with the cover exploded from the connector.
Figure 2:
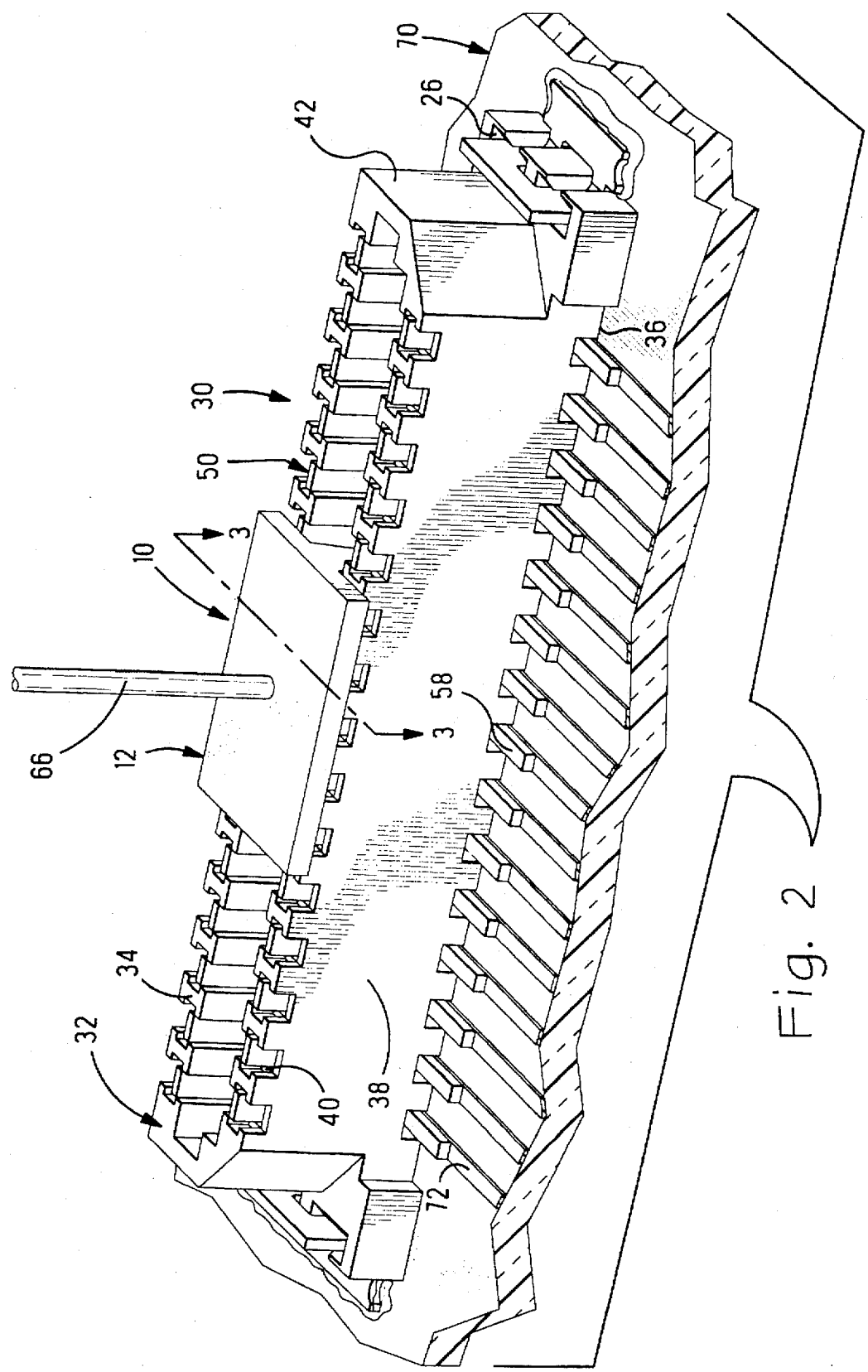
FIG. 2 is the connector assembly cover of FIG. 1 with the cover disposed in the housing.

For purposes of illustrating the invention, the cover 10 is being shown with a receptacle assembly 30. Referring now to FIGS. 1 through 4, cover 10 includes a plate 12 having an essentially flat planar upper surface 14 and an opposed lower surface 16, and a projection 18 extending along the center line of the lower plate surface 16 and perpendicular to plate 12. Projection 18 includes a configured forward portion 22 having a dimension of $d_1$ and an intermediate portion 20.

Connector assembly 30 includes a housing 32 having mating face 34 and opposed mounting face 36, opposed sidewalls 38 and opposed endwalls 42, the walls together defining a mating cavity 44 therebetween. Housing sidewalls 38 further have a plurality of terminal receiving passageways 40 extending from the mounting face 34 to the mating 36. A plurality of terminals 50 are disposed in the terminal receiving passageways 40. Terminals 50 include a first connecting portion 52 having contact sections 54 thereon, an intermediate body 56, and a surface mountable portion 58. The resilient portions 52 extend into the contact receiving cavity 44 and define a gap $d_2$ between opposed contact sections 54 as best seen in FIG. 5.

Figure 3:
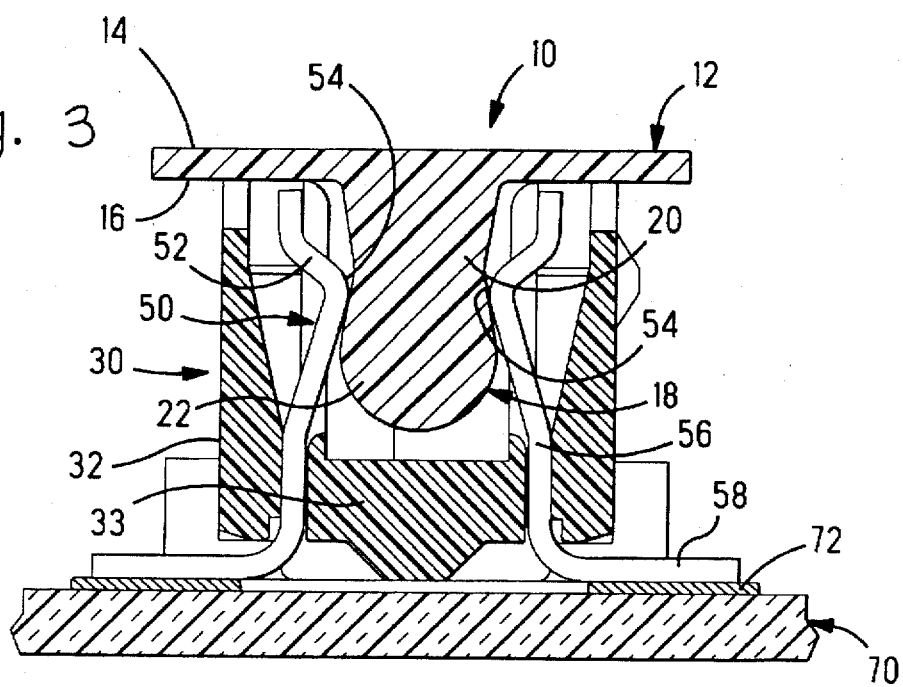
FIG. 3 is a cross-sectional view of the connector assembly of FIG. 2 taken along line 3—3 with the connector assembly mounted to a circuit board.
Figure 4:
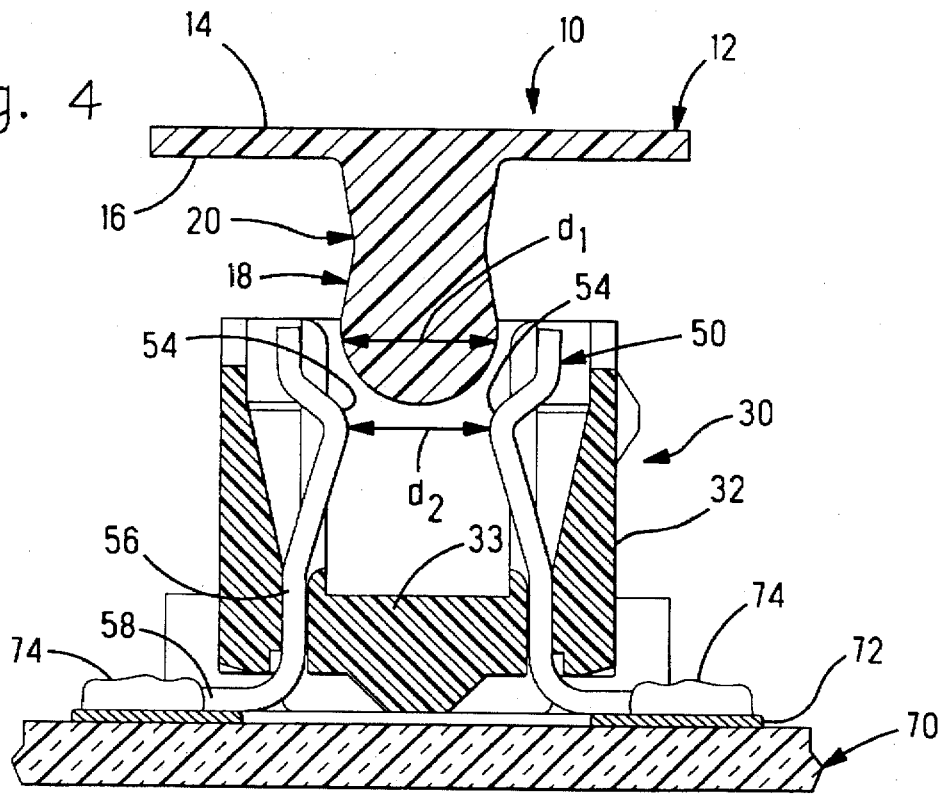
FIG. 4 is a view similar to that of FIG. 3 with the cover being removed after the connector assembly has been positioned on and soldered to the circuit board.

AS can be seen in FIGS. 3 and 4, the width $d_1$ of the configured forward portion 22 of cover projection 18 is wider than the gap $d_2$ between the corresponding resilient terminal portions 52 at the contact surfaces 54. When the projection 18 of cover 10 is inserted between the rows 60 of terminals 50 in the connector 30, the forward portion 22 engages the resilient portions 52 to force the terminals outwardly a sufficient distance to allow the cover to be inserted onto the connector housing 32. As the projection 18 is moved further into the housing cavity 44, the contact sections 54 of resilient terminal portions 52 move into the smaller dimensioned intermediate projection portion 20 thereby securably gripping the projection 18 between the resilient contact portions 54. The cover 10 is thereby securely held in place with sufficient force to allow vacuum pick-and-place equipment 66 to move the connector assembly 30 to the desired location on a circuit board 70. As shown in FIGS. 34, the surface mount contact portions 58 engage corresponding conductive pads 72 on the board 70. The cover 10 is removed from the connector assembly by gripping the outward edges of plate 12 and pulling the cover 10 from the connector 30 after soldering has occurred as shown in FIG. 4.

In use, assembly 30 cover 10 is fitted onto the electrical connector and the vacuum suction nozzle is engaged to the top surface 14 of plate 12 and the unit is a whole is picked up and moved to a circuit board 70 by applying negative pressure to the cover 10. In typical operations, the solder pads 72 of board 70 include solder paste 74 thereon which holds the surface mountable contact sections 56 in position. After positioning the connector assembly 30 the negative pressure is stopped thus releasing the connector assembly 30 and cover 10. The adhesiveness of the solder paste is sufficient to hold the assembly 30 in position on the board 70 while the board is moved for example through an infrared oven or other process as known in the art to complete the soldering process. The cover can than be removed from the mounted connector assembly 30 as shown in FIG. 4.

Figure 5:
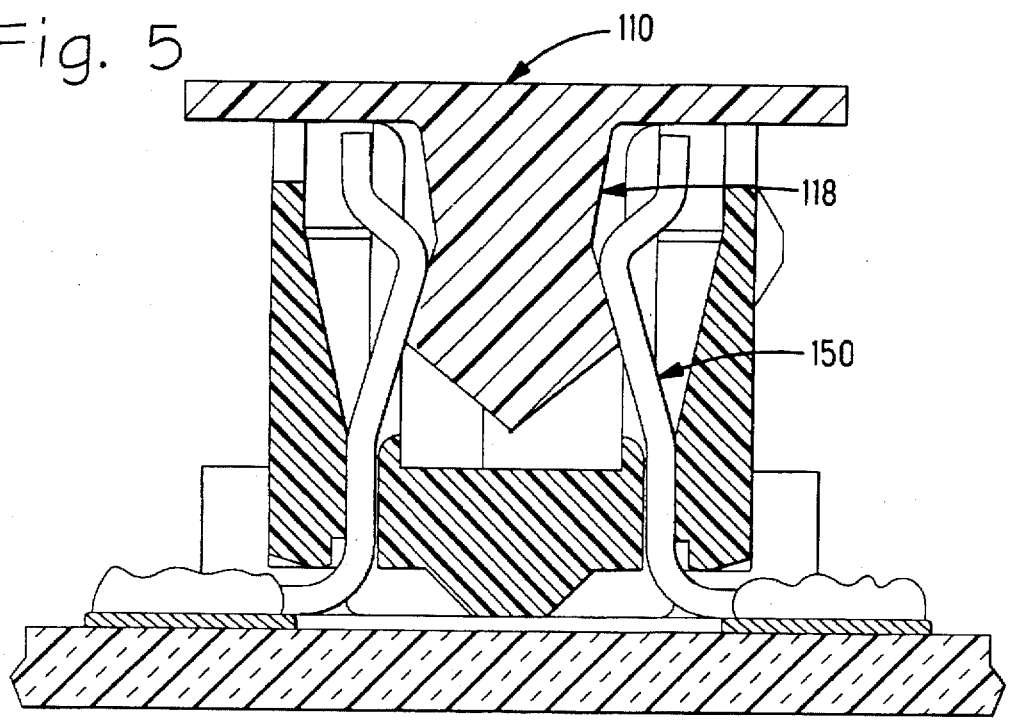
FIG. 5 is a view similar to that of FIG. 3 illustrating an alternative embodiment of the cover.

FIG. 5 shows a cross-section of another embodiment 110 of a cover in which the projection 118 has a different configuration to conform to the shape of the terminals 150 therein.

In the preferred embodiments, the cover is extruded or insert molded from a plastic that is compatible with the temperature used in the selected soldering process. The length of the cover 10 is determined in general by the size and weight of the connector assembly to which the cover will be mounted. The size of the cover plate is also determined by the size of the vacuum nozzle needed to pick up a connector of the selected weight. Preferably the plate is sized to extend a slight distance beyond the sidewalls of the housing for ease of removal while being narrow enough to permit the ends of the surface mount contact sections to be seen when the assembly and cover are viewed from the top surface thereof. The same size cover can be used for multiple sizes of the connector. A further consideration in determining the shape of the cover is that the projection or multiple projections engage the cooperating surfaces with sufficient force to hold the cover and connector assembly together during the pick-and-place operation. In the embodiments in which the cooperating surfaces are contact surfaces of the terminals, the configuration of the projection 18 is determined by the shape of the contacts that are in the particular housing. It is desirable that the opposed pairs of contacts provide a force sufficient to hold the cover and connector assembly together without damaging any plating on the contact surfaces 54 of the terminal 50. For longer and heavier connector assemblies, the cover may include a plurality of separate projections extending from the lower side of the plate intermediate the side edges thereof thus distributing the weight of the assembly more evenly.

Figure 6:
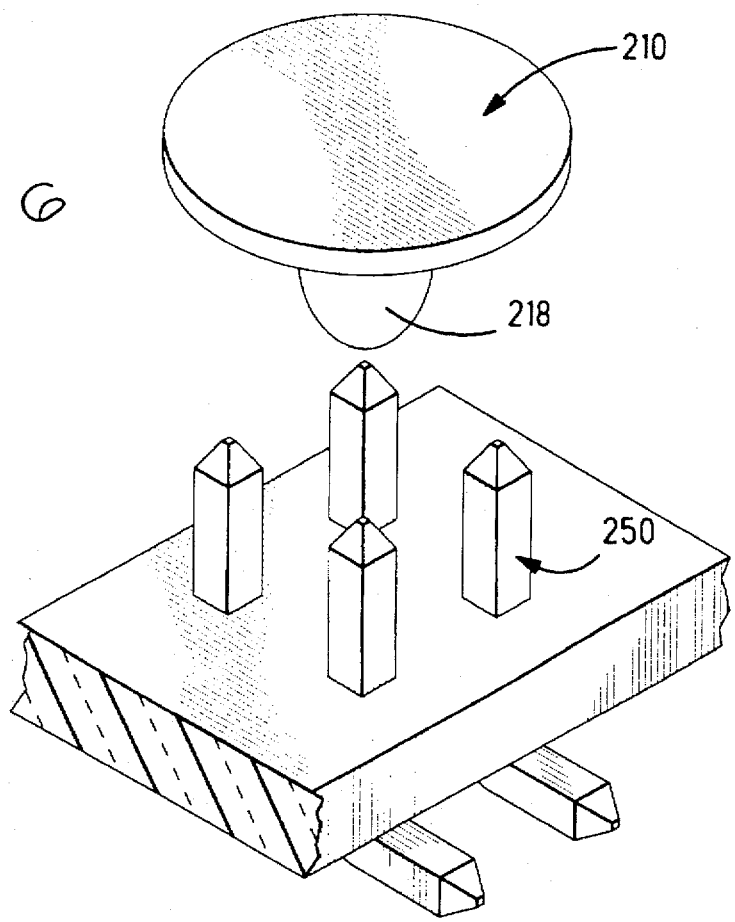
FIG. 6 illustrates a further alternative embodiment of the cover suitable for use with a connector having an array of pin terminals.

FIG. 6 shows a further embodiment 210 of the cover in which the projection 218 is dimensioned to be received in a gap formed by four pin terminals 250 of a pin header. In this embodiment the projection is shaped to provide an interference fit between the terminals 250 and the projection 218. As can best be seen from FIG. 3, the lower surface 16 of the top plate 12 is designed to be brought into contact with the top of the connector housing or the tips of the terminal as shown in FIG. 6.

Figure 7:
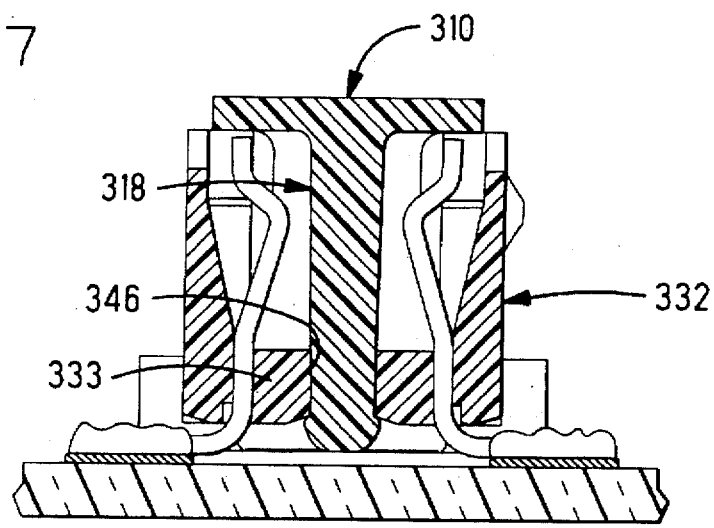
FIG. 7 is a cross-sectional view of another embodiment of the present invention.

FIG. 7 illustrates another embodiment 310 of a cover having a round projection 318 configured to be received in a cooperating aperture 346 in the transverse base of the connector housing 432.

Figure 9:
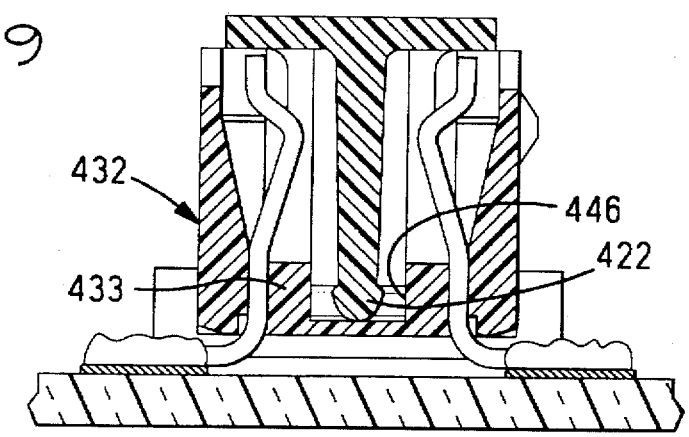
FIG. 9 is a cross-sectional view of the cover of FIG. 8 positioned in a connector.
Figure 8:
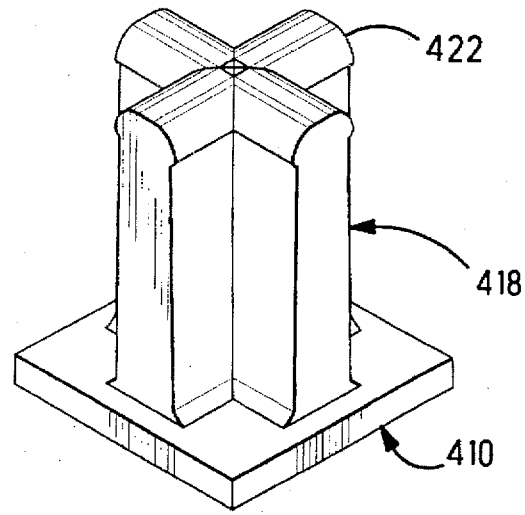
FIG. 8 is an isometric view of another embodiment of the invention.

FIGS. 8 and 9 illustrate a further embodiment 410 of a cover having a projection 418 configured to be received in cooperating recess 446 in the transverse base of the connector housing 432. In this embodiment, forward portion 422 of projection 418 is cross shaped. It is to be understood that other configurations may be used. Again, depending upon the length and weight of the connector assembly, the cover may include a plurality of projections, each receivable in a corresponding recess or aperture in the base of the housing. It is to be further understood that the covers of the present invention may also be used with connectors having terminals that are inserted into through holes of a circuit board as well as terminals that are surface mounted to pads on the circuit board.

It is thought that the cover of the present invention and many of its attendant advantages will be understood from the foregoing description. It is apparent that various changes may be made in the form, construction, and arrangement of parts thereof without departing from the spirit or scope of the invention, or sacrificing all of its material advantages.

We claim:

1. An improved cover for an electrical connector assembly, the cover being adapted to be releasably secured thereto for positioning said connector to a surface of an electrical article by use of a vacuum-suction nozzle, said connector assembly including a housing having a transverse body section and a plurality of electrical terminals disposed therein and extending above said body section, said cover being dimensioned to overlie at least a central region of said housing, said cover having a planar top surface for vacuum engagement with a vacuum-suction nozzle; the improvement comprising:

said cover has at least one projection extending substantially perpendicularly from a lower surface of said cover intermediate side edges thereof, said projection being dimensioned to be received in a central location of said connector assembly and to be releasably gripped by cooperating surfaces therein, said cooperating surfaces being defined by a recess in said transverse body section which receives one of said at least one projection therein, said cooperating surfaces exerting sufficient force against said at least one projection to retain said cover on said connector assembly during positioning of said connector assembly to said electrical article whereafter said cover is removable from said assembly.

2. The improved cover of claim 1 wherein said recess extends through said transverse body section.

3. A cover for an electrical connector assembly, the cover being adapted to be releasably secured thereto for positioning said connector assembly to a surface of an electrical article by use of a vacuum-suction nozzle, said connector assembly including a housing having a transverse body having a plurality of electrical terminals disposed therein and having tips extending above said transverse body, said terminal tips being free standing and located to define a gap therebetween; and said cover having a planar top surface for vacuum engagement with a vacuum-suction nozzle and at least one projection extending substantially perpendicularly from a lower surface of said cover intermediate side edges thereof, said projection being dimensioned to be disposed in said gap and engaged by sides of said terminal tips and only by said terminal tips, and releasably gripped thereby, said terminals exerting sufficient force against said at least one projection to retain said cover on said connector assembly during positioning of said connector assembly to said electrical article whereafter said cover is removable from said assembly.

4. The cover of claim 3 wherein said terminals are pin terminals.

* * * * *